United States Patent
Bera et al.

(10) Patent No.: US 7,972,467 B2
(45) Date of Patent: Jul. 5, 2011

(54) APPARATUS AND METHOD TO CONFINE PLASMA AND REDUCE FLOW RESISTANCE IN A PLASMA REACTOR

(75) Inventors: Kallol Bera, San Jose, CA (US); Yan Ye, Saratoga, CA (US); James D. Carducci, Sunnyvale, CA (US); Daniel J. Hoffman, Saratoga, CA (US); Steven C. Shannon, San Mateo, CA (US); Douglas A. Buchberger, Jr., Livermore, CA (US)

(73) Assignee: Applied Materials Inc., Santa Clara, CA (US)

( * ) Notice: Subject to any disclaimer, the term of this patent is extended or adjusted under 35 U.S.C. 154(b) by 1002 days.

(21) Appl. No.: 10/418,996

(22) Filed: Apr. 17, 2003

(65) Prior Publication Data

US 2004/0206309 A1   Oct. 21, 2004

(51) Int. Cl.
   *C23F 1/00*       (2006.01)
   *H01L 21/306*     (2006.01)
   *C23C 16/00*      (2006.01)

(52) U.S. Cl. .................. 156/345.1; 118/723 R

(58) Field of Classification Search .......... 118/715, 118/722, 723 R, 723 E; 156/345.29, 345.43
   See application file for complete search history.

(56) References Cited

U.S. PATENT DOCUMENTS

| 4,793,282 | A  | * | 12/1988 | Greenberg et al. ........... 118/667 |
| 6,093,281 | A  | * | 7/2000  | Wise et al. ................ 156/345.29 |
| 6,129,808 | A  | * | 10/2000 | Wicker et al. .............. 156/345.1 |
| 6,551,447 | B1 | * | 4/2003  | Savas et al. ............... 156/345.48 |
| 6,733,620 | B1 | * | 5/2004  | Sugiyama et al. ......... 156/345.29 |
| 2001/0014540 | A1 | * | 8/2001 | Shan et al. ..................... 438/710 |
| 2003/0092278 | A1 | * | 5/2003 | Fink ............................. 438/710 |

OTHER PUBLICATIONS

Mesh. Academic Press Dictionary of Science and Technology (1992). Retrieved Sep. 27, 2006, from xreferplus. http://www.xreferplus.com/entry/3128989.*
Office Action dated Oct. 8, 2008 for U.S. Appl. No. 12/201,156.
Office Action dated Feb. 5, 2009 for U.S. Appl. No. 11/924,086.
Office Action dated Apr. 22, 2009 for U.S. Appl. No. 12/201,156.

* cited by examiner

*Primary Examiner* — Maureen Gramaglia
(74) *Attorney, Agent, or Firm* — Patterson & Sheridan, L.L.P.

(57) ABSTRACT

An apparatus configured to confine a plasma within a processing region in a plasma processing chamber. In one embodiment, the apparatus includes a ring that has a baffle having a plurality of slots and a plurality of fingers. Each slot is configured to have a width less than the thickness of a plasma sheath contained in the processing region.

26 Claims, 3 Drawing Sheets

APPARATUS AND METHOD TO CONFINE PLASMA AND REDUCE FLOW RESISTANCE IN A PLASMA REACTOR

BACKGROUND OF THE INVENTION

1. Field of the Invention

Embodiments of the present invention generally relate to fabrication of semiconductor substrates, and more particularly, to plasma chambers having a confinement ring configured to confine plasma inside the chambers.

2. Description of the Related Art

Generally, a plasma reactor is used to process semiconductor substrates to produce microelectronic circuits. The reactor forms a plasma within a chamber containing the substrate to be processed. One of the processes that is used is a dry etch process, which typically operates within a vacuum vessel to allow the use of RF plasma conditions, to contain the reactive gases necessary for this process, and to prevent atmospheric contamination of the sample during processing. Chambers in such reactors are typically fabricated from aluminum or stainless steel and, as such, represent a potential contamination source. Other possible drawbacks to exposure of the vacuum vessel to plasma conditions include the cost of parts wear-out, defect issues from deposited polymeric species, and variability in the RF current paths. For these reasons, several approaches have been taken by etch system manufacturers to limit the extent of the plasma to a central region within the vacuum vessel and, in this way, segregate the functions of vacuum and plasma containment. This constraint on the extent of the plasma has generally been termed "confinement" of the plasma.

One approach for plasma confinement is to increase the lifetime of electrons to enhance the plasma efficiency by applying magnetic fields in magnetically enhanced reactive ion etch (MERIE) plasma reactors. While this approach allows the confinement of electrons, both ionic species and radical neutrals often interact with chamber walls, thereby causing contamination sputtering and defect issues from polymer build-up.

Therefore, a need exists for an improved apparatus to confine plasma within a processing region inside the plasma chamber.

SUMMARY OF THE INVENTION

Embodiments of the present invention are generally directed to an apparatus configured to confine a plasma within a processing region in a plasma processing chamber. In one embodiment, the apparatus includes a ring that has a baffle having a plurality of slots and a plurality of fingers. Each slot is configured to have a width less than the thickness of a plasma sheath contained in the processing region.

Embodiments of the present invention are also directed to a plasma reactor that includes a chamber, a pedestal disposed within the chamber, a gas distribution plate disposed within the chamber overlying the pedestal, and a ring disposed inside the chamber. The ring includes a baffle having a plurality of slots and a plurality of fingers radially disposed between the pedestal and the chamber. Each slot is configured to have a width less than the thickness of a plasma sheath contained in a processing region inside the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
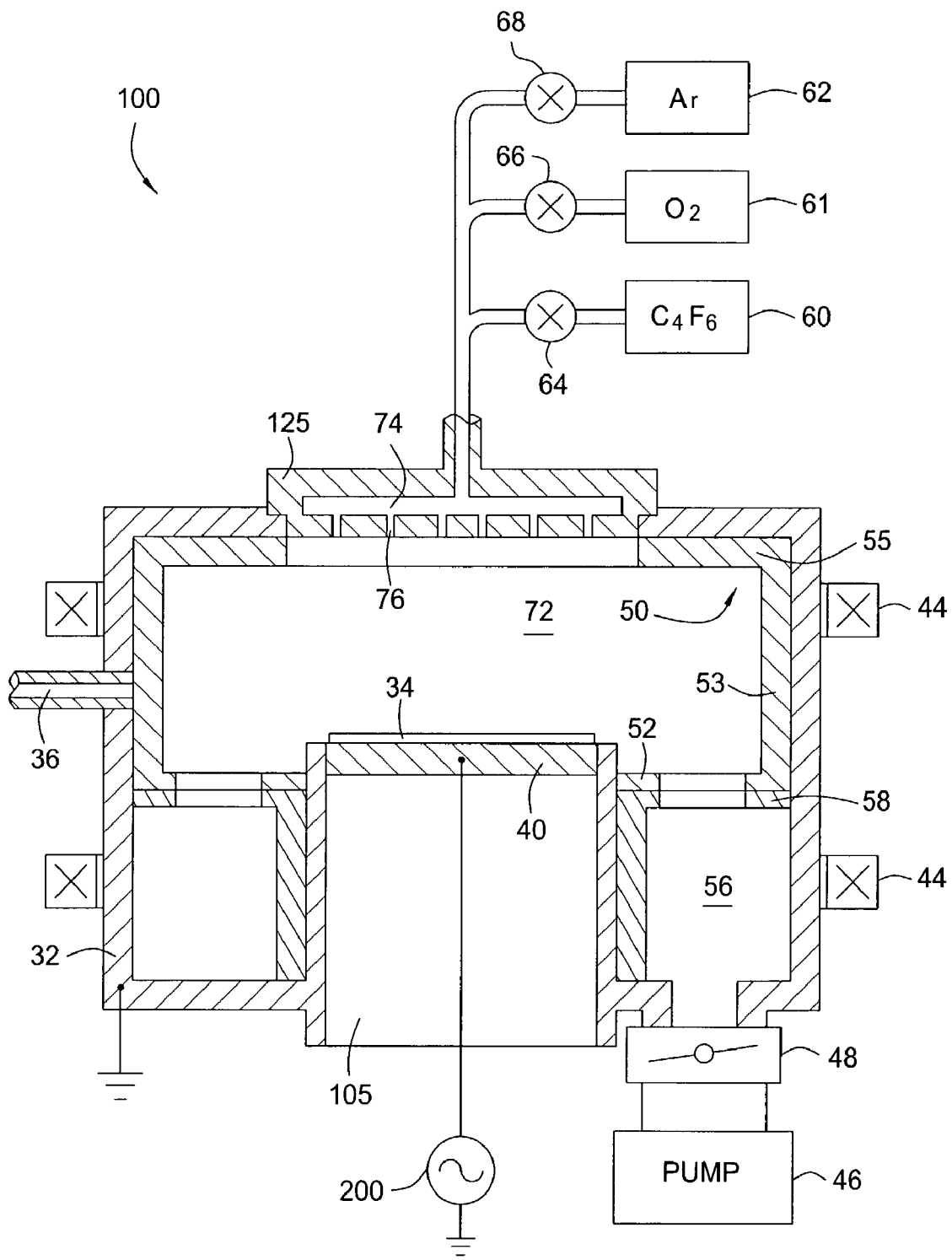
FIG. 1 illustrates an example of a plasma reactor that includes various embodiments of the invention.

FIG. 1 illustrates an example of a plasma reactor 100 that includes various embodiments of the invention. The plasma reactor 100 includes a grounded vacuum chamber 32, which may include liners to protect the walls. A substrate 34 is inserted into the chamber 32 through a slit valve opening 36 and is placed on a cathode pedestal 105 with an electrostatic chuck 40 selectively clamping the substrate. The chuck powering is not illustrated. Unillustrated fluid cooling channels through the pedestal 105 maintain the pedestal at reduced temperatures. A thermal transfer gas, such as helium, is supplied to unillustrated grooves in the upper surface of the pedestal 105. The thermal transfer gas increases the efficiency of thermal coupling between the pedestal 105 and the substrate 34, which is held against the pedestal 105 by the electrostatic chuck 40 or an alternatively used peripheral substrate clamp.

An RF power supply 200, preferably operating at 13.56 MHz, is connected to the cathode pedestal 105 and provides power for generating the plasma while also controlling the DC self-bias. Magnetic coils 44 powered by unillustrated current supplies surround the chamber 32 and generate a slowly rotating (on the order of seconds and typically less than 10 ms), horizontal, essentially DC magnetic field in order to increase the density of the plasma. A vacuum pump system 46 pumps the chamber 32 through an adjustable throttle valve 48 and a plenum 56. A confinement ring 50 is disposed inside the chamber 32 to confine the plasma within a processing region 72, which is defined inside the confinement ring 50. Various embodiments of the confinement ring 50 will be discussed in the following paragraphs.

Processing gases are supplied from gas sources 60, 61, 62 through respective mass flow controllers 64, 66, 68 to a gas distribution plate 125 positioned in the roof of the chamber 32 overlying the substrate 34 and across from a processing region 72. The distribution plate 125 includes a manifold 74 configured to receive the processing gas and communicate with the processing region 72 through a showerhead having a large number of distributed apertures 76, thereby injecting a more uniform flow of processing gas into the processing region 72. An unillustrated VHF power supply, preferably operating at about 162 MHz, may be electrically connected to the gas distribution plate 125 to provide power to the gas distribution plate 125 for generating the plasma.

Other details of the reactor 100 are further described in commonly assigned U.S. Pat. No. 6,451,703, entitled "Magnetically Enhanced Plasma Etch Process Using A Heavy Fluorocarbon Etching Gas", issued to Liu et al. and U.S. Pat. No. 6,403,491, entitled "Etch Method Using A Dielectric Etch Chamber With Expanded Process Window", issued to Liu et al., which are both incorporated by reference herein to the extent not inconsistent with the invention. Although various embodiments of the invention will be described with reference to the above-described reactor, the embodiments of the invention may also be used in other reactors, such as one described in commonly assigned U.S. Ser. No. 10/028,922 filed Dec. 19, 2001, entitled "Plasma Reactor With Overhead RF Electrode Tuned To The Plasma With Arcing Suppression", by Hoffman et al., which is incorporated by reference herein to the extent not inconsistent with the invention.

Figure 2:
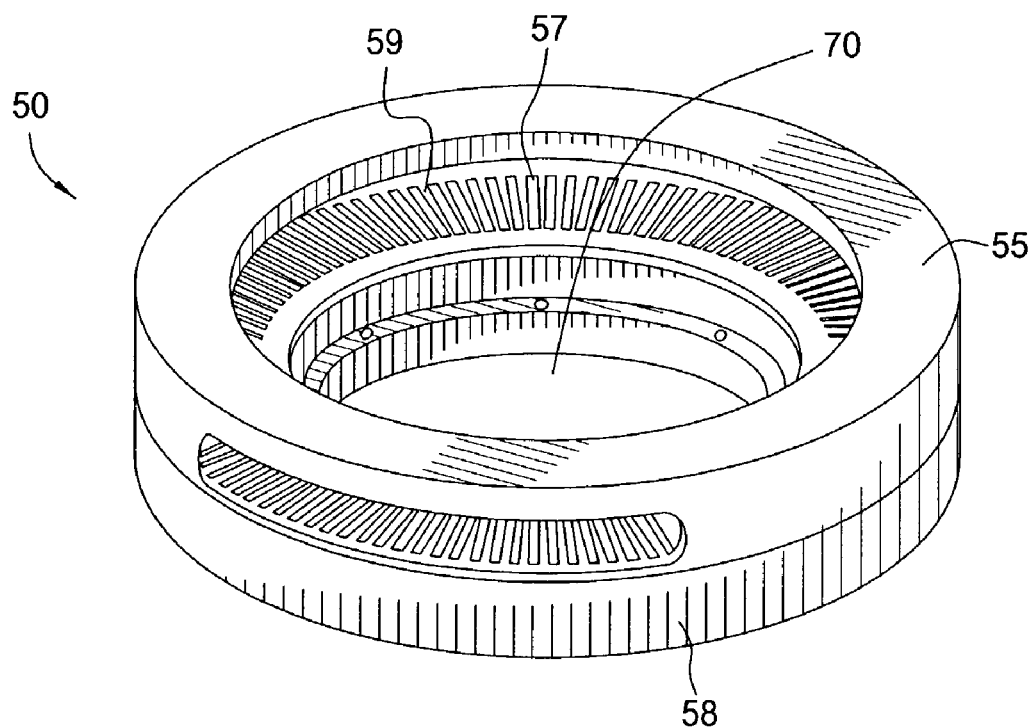
FIG. 2 illustrates a perspective view of the confinement ring in accordance with an embodiment of the invention in greater detail.

FIG. 2 illustrates a perspective view of the confinement ring 50 in accordance with one embodiment of the invention in greater detail. The confinement ring 50 is configured to confine plasma inside the processing region 72 and to reduce flow resistance across the chamber 32. The confinement ring 50 includes a baffle 55 and a base 58 coupled to a bottom portion of the baffle 55. The base 58 is generally configured to provide electrical grounding and mechanical strength for the confinement ring 50. The baffle 55 defines an opening 70 at its top portion. The opening 70 is configured to receive the showerhead of the gas distribution plate 125 so that gases flowing the showerhead will be confined within the processing region 72 inside the baffle 55. The baffle 55 further includes a plurality of slots 57 and a plurality of fingers 59, disposed around the substrate 34. Neutrals in the plasma are configured to pass through the slots 57 into the plenum 56. The slots 57 are designed such that the thickness or width of the plasma sheath is greater than the width of each slot. In this manner, ions and radicals in the plasma are prevented from passing through the confinement ring 50, thereby isolating the plenum 56 from the processing region 72. As a result, polymer build up inside the plenum 56 may be minimized and the amount of power that can be applied to generate the plasma may be increased. In one embodiment, each slot 57 is designed with a width of less than about twice the width or thickness of the plasma sheath. The confinement ring 50 may be made from a material that is electrically conductive to provide a ground path for the RF power supply and the VHF power supply when the plasma is in contact with the confinement ring 50. The confinement ring 50 may also be made from a material that is thermally conductive and etch resistant to minimize localized heating, contamination and process drift. For example, the baffle 55 may be made from silicon carbide (SiC), while the base 58 may be made from aluminum (Al).

Figure 3:
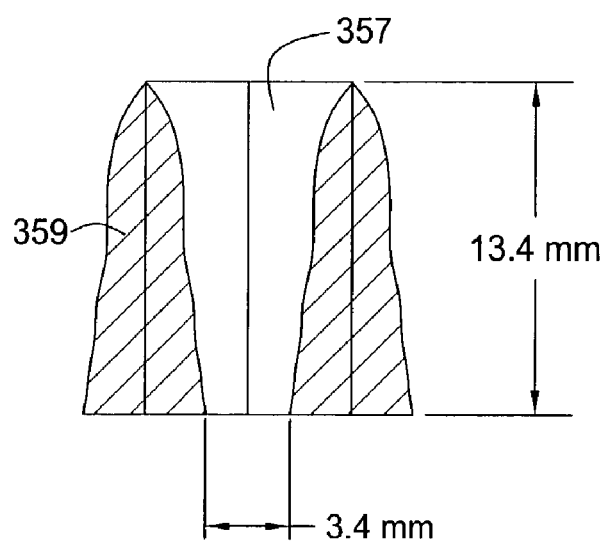
FIG. 3 illustrates a cross sectional view of a confinement ring slot in accordance with an embodiment of the invention.
Figure 4:
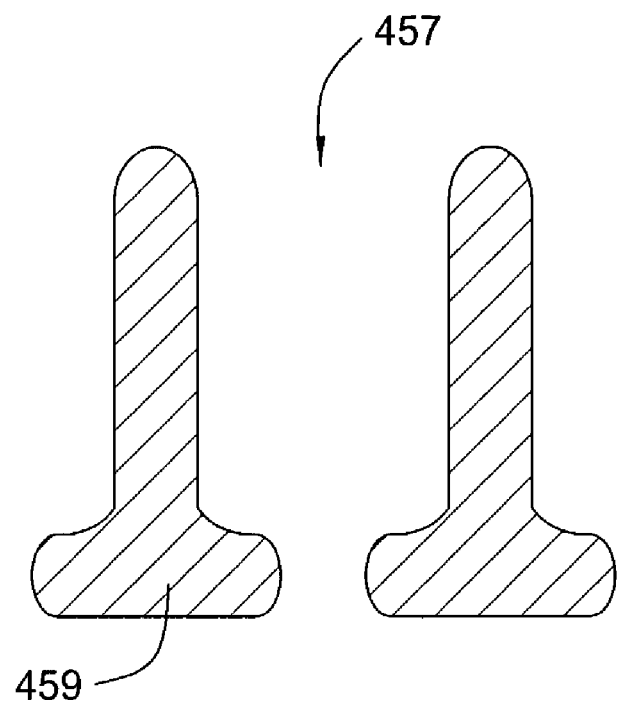
FIG. 4 illustrates a cross sectional view of a confinement ring slot in accordance with another embodiment of the invention.

FIG. 3 illustrates a cross sectional view of a slot 357 in accordance with an embodiment of the invention. As shown in FIG. 3, the finger 359 on each side of the slot 357 has a substantially triangular cross section such that the width at the slot's upper surface is greater than the width at the slot's lower surface. For example, the width of the slot may range from about 3 mm to about 4 mm and the height of the slot may range from about 12 mm to about 15 mm. In one embodiment, the width at the slot's lower surface is about 3.4 mm while the height of the slot is about 13.4 mm. Another embodiment of the invention is illustrated in FIG. 4 in which the finger 459 on each side of the slot 457 has a substantially inverted T cross section. In this manner, the slots in accordance with various embodiments of the invention are configured to reduce the flow resistance (or the pressure drop) through the confinement ring 50 while maintaining plasma confinement. By reducing the flow resistance through the confinement ring 50, the process window for various etch applications for a given pump is improved and the required power to operate the vacuum pumping system 46 is reduced. It has been observed that the confinement ring 50 in accordance with embodiments of the invention is configured to reduce chamber contamination and chamber cleaning time. It has also been observed that the confinement ring 50 is configured to improve pressure uniformity across a substrate, thereby improving the overall process uniformity.

Figure 5:
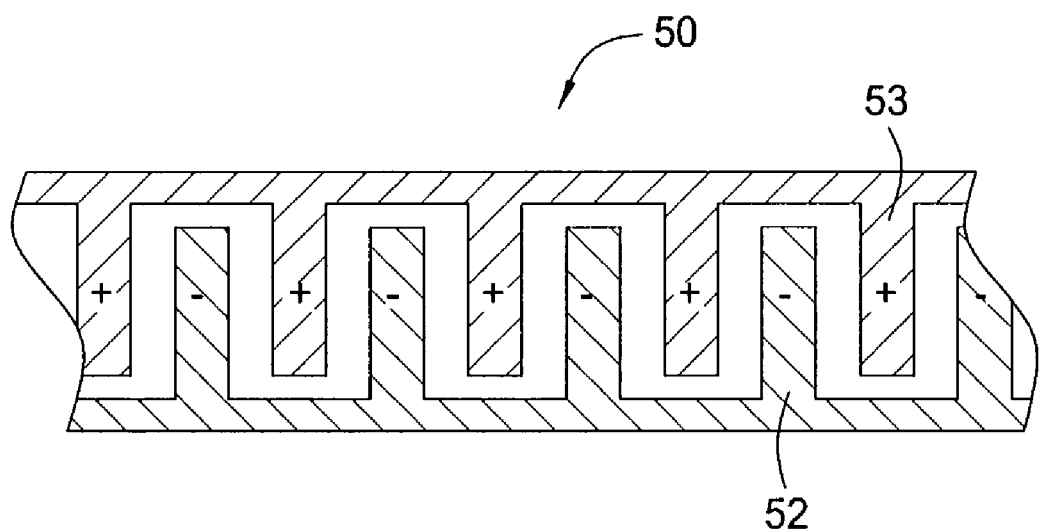
FIG. 5 illustrates biasing alternate confinement ring fingers with a positive bias and the fingers between those alternate fingers with a negative bias in accordance with an embodiment of the invention.

In accordance with another embodiment of the invention, one set of fingers extends from an outside wall 53 of the confinement ring 50 while another set of fingers extends from an inside wall 52 of the confinement ring 50, which is disposed around the substrate support pedestal 105. Each of the fingers extending from the inside wall 52 is positioned between two fingers extending from the outer wall 53. In this manner, every other finger is a finger from the same wall. In one embodiment, the fingers extending from the outer wall 53 are not in electrical contact with the fingers extending from the inner wall 52. In this embodiment, the fingers extending from the outer wall 53 may be biased with a positive bias (e.g., about 50 DC volts) and the fingers extending from the inner wall 52 may be biased with a negative bias (e.g., about −50 DC volts). (See FIG. 5). In this manner, the electric field through the confinement ring 50 is modified so that ions and radicals in the plasma are attracted toward the fingers, thereby causing the ions and the radicals to impinge on the fingers rather than going directly through the slots. As the ions and the radicals impinge on the fingers, the ions and the radicals become neutrals, which will flow through the slots into the plenum 56. In this manner, plasma confinement is further improved. In yet another embodiment, a positive bias (e.g., about 100 volts) is applied to each finger to increase the thickness of the plasma sheath.

While the foregoing is directed to embodiments of the present invention, other and further embodiments of the invention may be devised without departing from the basic scope thereof, and the scope thereof is determined by the claims that follow.

The invention claimed is:

1. An apparatus configured to confine a plasma within a processing region in a plasma processing chamber, comprising:
   a confinement ring comprising a baffle including an opening configured to receive a showerhead and defining a plurality of slots and a plurality of fingers, wherein each finger has a substantially inverted T cross section and wherein the processing region is defined inside the confinement ring.

2. The apparatus of claim 1, wherein the width of each slot at an upper surface of the baffle is greater than the width of each slot at a lower surface of the baffle.

3. The apparatus of claim 1, wherein the width of each slot at a lower surface of the baffle is about 3.4 mm.

4. The apparatus of claim 1, wherein the height of each slot is about 13.4 mm.

5. The apparatus of claim 1, wherein the baffle is made from silicon carbide.

6. The apparatus of claim 1, wherein the ring further comprises a base coupled to the baffle.

7. The apparatus of claim 6, wherein the base is coupled to a bottom portion of the baffle.

8. The apparatus of claim 6, wherein the base is made from aluminum.

9. The apparatus of claim 1, wherein the ring is configured to be disposed between a substrate support pedestal and the chamber.

10. The apparatus of claim 1, wherein each finger is biased with a positive voltage.

11. The apparatus of claim 1, wherein each finger is biased with a voltage of about 100 volts.

12. The apparatus of claim 1, wherein the ring provides a ground path for at least one of a radio frequency power supply and a very high frequency power supply, each being electrically coupled to the chamber.

13. An apparatus configured to confine a plasma within a processing region in a plasma processing chamber, comprising:
   a confinement ring, said confinement ring having an inside wall and an outside wall, wherein a plurality of fingers extend from the inside wall and a plurality of fingers extend from the outside wall, wherein each finger extending from said inside wall is positioned between two fingers extending from said outside wall, wherein said fingers extending from said inside wall do not extend to the outside wall, wherein said fingers extending from the outside wall do not extend to the inside wall and wherein the processing region is defined inside the confinement ring.

14. The apparatus of claim 13, wherein the plurality of fingers comprise alternate fingers that are biased with a positive bias and each finger between the alternate fingers is biased with a negative bias to cause ions from the plasma to impinge on the fingers.

15. The apparatus of claim 13, wherein the plurality of fingers comprise alternate fingers that are biased with a voltage of about 50 volts and each finger between the alternate fingers is biased with a voltage of about negative 50 volts.

16. A plasma reactor, comprising:
   a chamber;
   a pedestal disposed within the chamber;
   a gas distribution plate disposed within the chamber overlying the pedestal; and
   a confinement ring disposed inside the chamber, wherein the confinement ring comprises a baffle having a plurality of slots and a plurality of fingers radially disposed between the pedestal and the chamber, wherein each finger has one of a substantially inverted T cross section wherein the confinement ring is configured to confine plasma inside a processing region is defined inside the confinement ring.

17. The reactor of claim 16, wherein the width of each slot at an upper surface of the baffle is greater than the width of each slot at a lower surface of the baffle.

18. The reactor of claim 16, wherein the width of each slot at a lower surface of the baffle is about 3.4 mm.

19. The reactor of claim 16, wherein each slot has a height of about 13.4 mm.

20. The reactor of claim 16, wherein the baffle is made from silicon carbide.

21. The reactor of claim 16, wherein each finger is biased with a positive voltage.

22. The reactor of claim 16, wherein each finger is biased with a voltage of about 100 volts.

23. The reactor of claim 16 wherein the ring provides a ground path for at least one of a radio frequency power supply and a very high frequency power supply, each being electrically coupled to the chamber.

24. A plasma reactor comprising:
   a chamber;
   a pedestal disposed within the chamber;
   a gas distribution plate disposed within the chamber overlying the pedestal; and
   a confinement ring disposed inside the chamber, wherein the confinement ring comprises a plurality of fingers radially disposed between the pedestal and the chamber, said ring also comprising an inside wall and an outside wall, wherein a plurality of fingers extend from the inside wall and a plurality of fingers extend from the outside wall, each finger extending from the inside wall is positioned between two fingers extending from the outside wall, wherein said fingers extending from said inside wall do not extend to the outside wall, and wherein said fingers extending from said outside wall do not extend to said inside wall, and is configured to confine plasma inside a processing region which is defined inside the confinement ring.

25. The reactor of claim 24, wherein the plurality of fingers comprise alternate fingers that are biased with a positive bias and each finger between the alternate fingers is biased with a negative bias to cause ions from the plasma to impinge on the fingers.

26. The reactor of claim 24, wherein the plurality of fingers comprise alternate fingers that are biased with a voltage of about 50 volts and each finger between the alternate fingers is biased with a voltage of about negative 50 volts.

* * * * *